US011584632B2

(12) United States Patent
Greenberg et al.

(10) Patent No.: US 11,584,632 B2
(45) Date of Patent: Feb. 21, 2023

(54) SYSTEMS AND METHODS OF SELECTING OPERATIONS FOR A DISPENSER BASED ON PATH OF TRAVEL

(71) Applicant: Marmon Foodservice Technologies, Inc., Osseo, MN (US)

(72) Inventors: Jacob C. Greenberg, Elgin, IL (US); Christopher D. Coul, Geneva, IL (US); James Bendig, Naperville, IL (US)

(73) Assignee: Marmon Foodservice Technologies, Inc., Osseo, MN (US)

( * ) Notice: Subject to any disclaimer, the term of this patent is extended or adjusted under 35 U.S.C. 154(b) by 0 days.

(21) Appl. No.: 17/374,278

(22) Filed: Jul. 13, 2021

(65) Prior Publication Data

US 2022/0017350 A1 Jan. 20, 2022

Related U.S. Application Data

(60) Provisional application No. 63/053,255, filed on Jul. 17, 2020.

(51) Int. Cl.
*B67D 1/08* (2006.01)
*B67D 1/12* (2006.01)
*B67D 1/00* (2006.01)

(52) U.S. Cl.
CPC ......... *B67D 1/0888* (2013.01); *B67D 1/1277* (2013.01); *B67D 1/0011* (2013.01); *B67D 2001/0093* (2013.01)

(58) Field of Classification Search
CPC .. B67D 1/0888; B67D 1/1277; B67D 1/0011; B67D 2001/0093; B67D 1/07;
(Continued)

(56) References Cited

U.S. PATENT DOCUMENTS

| 4,202,387 A | 5/1980 | Upton |
|---|---|---|
| 5,868,311 A | 2/1999 | Cretu-Petra |

(Continued)

FOREIGN PATENT DOCUMENTS

| CN | 105264312 B | 6/2018 |
|---|---|---|
| EP | 1647951 A1 | 4/2006 |

(Continued)

OTHER PUBLICATIONS

International Search Report and Written Opinion for PCT/US2021/035654, dated Sep. 1, 2021.

(Continued)

*Primary Examiner* — Donnell A Long
(74) *Attorney, Agent, or Firm* — Andrus Intellectual Property Law, LLP

(57) ABSTRACT

An example of a beverage dispenser includes a nozzle and a valve coupled upstream of the nozzle. A sensor is operable to detect an object within a detection zone and provide a signal representative of a distance between the object and the sensor. A controller is configured to receive the signal from the sensor. The controller is configured to determine a sub-zone from a plurality of sub-zones within the detection zone in which the object is located. The valve is controlled between an open condition to dispense the substance through the nozzle and a closed condition based upon the determined sub-zone.

19 Claims, 7 Drawing Sheets

(58) Field of Classification Search
CPC .......... G01S 17/04; H03K 2217/94036; H03K 2217/94108; H03K 2217/94116; H03K 17/941

See application file for complete search history.

(56) References Cited

U.S. PATENT DOCUMENTS

| | | | |
|---|---|---|---|
| 6,053,359 | A | 4/2000 | Goulet et al. |
| 6,354,468 | B1 | 3/2002 | Riek |
| 6,394,153 | B2 | 5/2002 | Skell et al. |
| 6,688,134 | B2 | 2/2004 | Barton et al. |
| 6,789,585 | B1 | 9/2004 | Janke |
| 7,614,524 | B2 | 11/2009 | Girard et al. |
| 7,673,661 | B2 | 3/2010 | Chase et al. |
| 8,490,540 | B2 | 7/2013 | Webster et al. |
| 8,950,254 | B2 | 2/2015 | Bernhardsgruetter et al. |
| 9,417,003 | B2 | 8/2016 | Baack |
| 9,477,317 | B1 | 10/2016 | Clements |
| 9,840,407 | B2 | 12/2017 | Difatta et al. |
| 9,957,147 | B2 * | 5/2018 | Ka ............ B67D 1/0888 |
| 10,053,354 | B2 | 8/2018 | Rosenlund et al. |
| 10,178,928 | B2 | 1/2019 | Ophardt et al. |
| 10,235,865 | B2 | 3/2019 | Thyroff |
| 10,258,191 | B2 | 4/2019 | Apone et al. |
| 10,269,082 | B2 | 4/2019 | Morris et al. |
| 10,362,896 | B2 | 7/2019 | Apone et al. |
| 10,571,041 | B2 | 2/2020 | Bischel |
| 2003/0155031 | A1 | 8/2003 | Barton et al. |
| 2008/0282897 | A1 | 11/2008 | Webster et al. |
| 2009/0178728 | A1 | 7/2009 | Cochran et al. |
| 2009/0308494 | A1 | 12/2009 | Linn |
| 2013/0075426 | A1 | 3/2013 | Crane et al. |
| 2015/0191341 | A1 * | 7/2015 | Martindale .......... B67D 1/0882 345/173 |
| 2016/0207753 | A1 | 7/2016 | Choi et al. |
| 2017/0079468 | A1 | 3/2017 | Apone et al. |
| 2017/0079469 | A1 | 3/2017 | Apone et al. |
| 2018/0201492 | A1 | 7/2018 | Jung et al. |
| 2018/0327243 | A1 | 11/2018 | Rider et al. |
| 2019/0223654 | A1 | 7/2019 | Apone et al. |
| 2020/0000274 | A1 | 1/2020 | Apone et al. |
| 2020/0055720 | A1 | 2/2020 | Volftsun et al. |

FOREIGN PATENT DOCUMENTS

| | | |
|---|---|---|
| EP | 2449929 A1 | 5/2012 |
| EP | 3172970 A1 | 5/2017 |
| EP | 3275348 A1 | 1/2018 |
| EP | 3670436 A1 | 6/2020 |

OTHER PUBLICATIONS

Extended European Search Report for Application No. EP21185926.9, dated Dec. 13, 2021.

* cited by examiner

SYSTEMS AND METHODS OF SELECTING OPERATIONS FOR A DISPENSER BASED ON PATH OF TRAVEL

CROSS-REFERENCE TO RELATED APPLICATIONS

The present application claims priority to U.S. Provisional Patent Application No. 63/053,255 filed on Jul. 17, 2020, and which is incorporated by reference herein in its entirety.

FIELD

The present disclosure generally relates to systems and methods of selecting operations for a dispenser based on a path of travel, and more particularly to systems and methods for selecting between dispensing and cleaning for beverage and/or ice dispensers based on the path of travel of a hand or cup.

BACKGROUND

The following U.S. Patents and Patent Applications provide background information and are incorporated by reference in entirety.

U.S. Pat. No. 10,315,236 discloses a dispenser with cleaning functionality. The dispenser enters a cleaning mode upon reading a QR code selected from a plurality of instructional QR code inputs.

U.S. Pat. No. 10,077,180 discloses a beverage dispensing head with a mixing nozzle configured to dispense a flow of beverage. A valve is configured to control the flow of beverage via the mixing nozzle and a switch is movable into and between a closed position in which the valve opens the flow of beverage via the mixing nozzle and an open position in which the valve closes the flow of beverage via the mixing nozzle. A lighting module disposed in the housing is configured to illuminate the front of the housing and the base of the housing when the switch is moved into the closed position.

U.S. Pat. No. 9,840,407 discloses a beverage dispensing system that includes a plurality of beverage sources each containing a beverage component, and at least one flow valve connected to one or more of the beverage sources and operable to control a flow of the beverage component therefrom. The system further includes a graphical display that presents a plurality of available beverages and a gesture capture device that receives a selection gesture input to select a beverage from the plurality of available beverages. A controller is also included that adjusts the at least one flow valve based on the selection gesture input to dispense the selected beverage.

U.S. Pat. No. 6,053,359 discloses an automated system for preparing and delivering postmix beverages in response to one or more drink orders being entered from a remote point of sale unit or a local keypad that includes: a postmix beverage preparation assembly for dispensing ice and a selected postmix beverage into a cup; an oblong carousel type conveyor assembly including a plurality of upwardly open cup holders which are driven by a motor driven belt so as to pass beneath a cup dispensing station, an ice dispensing station, a beverage dispensing station, and a plurality of pick-up stations; a cup storage and dispenser assembly including a bidirectionally rotatable turret upon which is mounted a plurality of different sized cup supply tubes for holding a respective stack of beverage cups; and a pneumatic vertically driven cup gripper/extractor mechanism having a pair of pneumatically operated gripper arms which operate to remove a cup from a selected supply tube on the turret and placing the extracted cup into an empty cup holder which is then transported past the dispensing stations and then to a pick-up station on the conveyor for manual removal by an attendant.

U.S. Patent Application Publication No. 2013/0075426 discloses a beverage dispensing apparatus that includes a dispensing structure, a transportation mechanism linked with the dispensing structure, and a staging structure linked with the transportation structure. A control system is linked with the dispensing structure, staging structure, and the transportation mechanism. A sensor mechanism is linked with the control system. The sensor mechanism provides signals indicating the position of a cup. A cup identification system having an interactive display is connected to the control system. The display has visual characteristics indicating the position and characteristics of a cup.

BRIEF DISCLOSURE

An example of a beverage dispenser includes a nozzle and a valve coupled upstream of the nozzle. The valve is configured to control a flow of a substance through the valve to the nozzle. A solenoid is operatively connected to the valve and configured to operate the valve between an open condition and a closed condition. A sensor is operable to detect an object within a detection zone and provide a signal representative of a distance between the object and the sensor. A controller is configured to receive the signal from the sensor. The controller is configured to determine, from the signal, a sub-zone from a plurality of sub-zones within the detection zone in which the object is located. The controller is configured to operate the solenoid to control the valve between an open condition to dispense the substance through the nozzle and a closed condition based upon the determined sub-zone.

In further examples of beverage dispensers, the controller is configured to operate the beverage dispenser in a dispense mode in which the valve is controlled in the open condition and the controller is configured to operate in a standby mode in which the valve is controlled in the closed condition. The sensor may be a proximity sensor. The detection zone may be defined by a maximum effective distance of the sensor and the detection zone defines a distant zone outside of the detection zone, wherein the plurality of sub-zones includes a dispense zone as one of the sub-zones. The plurality of sub-zones may include a clean zone wherein the clean zone includes a portion of the detection zone extending from the sensor in the direction of the maximum effective distance to the dispense zone. The plurality of sub-zones includes an approach zone that extends from the maximum effective distance to the dispense zone.

In examples of beverage dispensers, the controller may be configured to determine an approach path of the object within one or more sub-zones. The controller may be configured to determine a current sub-zone in which the object is located and to determine a current mode of operation of the dispenser. The controller may select a predetermined evaluation time from a plurality of predetermined evaluation times with which to evaluate the detection of the object. The controller may compare an elapsed time to the selected predetermined evaluation time and based upon the comparison set the current mode of operation of the beverage dispenser. The plurality of predetermined evaluation times may include a first evaluation time and a second evaluation time wherein the first evaluation time is shorter than the second evaluation time. The current sub-zone may be the dispense zone and the current mode of operation may be a standby mode, and the controller may further be configured to determine a prior zone of the plurality of sub-zones in which the object was located and based upon the determined prior zone the controller selects between the first evaluation time and the second evaluation time. The prior zone may be the approach zone and the dispenser selects the first evaluation time. The prior zone may be the distant zone or the clean zone and the controller selects the second evaluation time. The current sub-zone may be the clean zone and the current mode of operation may be a standby mode and the controller selects a third evaluation time of the plurality of predetermined evaluation times, the third evaluation time being longer than the first evaluation time and the second evaluation time.

An example of a method of dispensing a beverage dispenser includes detecting an object within a detection zone of a sensor. The sensor produces a signal representative of a distance between the object and the sensor. A current sub-zone from a plurality of sub-zones within the detection zone in which the object is located is determined from the signal. A current mode of operation of the dispenser is determined. A predetermined evaluation time is selected from a plurality of predetermined evaluation times based upon the determined current sub-zone and current mode of operation. The beverage dispense is controlled in a dispense mode with a valve in an open condition to dispense a substance through a nozzle or controlling the beverage dispenser in a standby mode with the valve in a closed condition based upon an evaluation using eh selected predetermined evaluation time.

In further examples of a method of dispensing a beverage, the evaluation using the selected predetermined evaluation time is a comparison of an elapsed time to the selected predetermined evaluation time. The detection zone may be defined by a maximum effective distance of the sensor and the detection zone defines a distant zone outside of the detection zone, wherein the plurality of sub-zones within the detection zone includes a dispense zone and a clean zone, wherein the clean zone is a portion of the detection zone between the sensor and the dispense zone. The plurality of sub-zones may further include an approach zone that extends from the maximum effective distance to the dispense zone. The plurality of predetermined evaluation times includes a first evaluation tie and a second evaluation time and the first evaluation time is shorter than the second evaluation time. The current sub-zone may be the dispense zone and the current mode of operation may be a standby mode and the method includes determining with the controller a prior zone of the plurality of sub-zones in which the object was located. The controller selects between the first evaluation time and the second evaluation time based upon the determined prior zone. If the prior zone is the approach zone the first evaluation time may be selected. If the prior zone is the clean zone or the distant zone, the second evaluation time may be selected. The current sub-zone may be the clean zone and the current mode of operation may be a standby mode, and the method further includes selecting a third evaluation time of the plurality of predetermined evaluation times wherein the third evaluation time is longer than the first evaluation time and the second evaluation time.

BRIEF DESCRIPTION OF THE DRAWINGS

The present disclosure is described with reference to the following Figures.

DETAILED DISCLOSURE

The present disclosure generally relates to controls for dispensers, such as beverage and/or ice dispensers, and particularly the selection of different modes thereof. In many cases, dispensers use sensors for detecting inputs from a user, which include both touch-based and touchless sensors. These sensors must be cleaned periodically; however, the present inventor has recognized that the very act of cleaning in some cases causes actuation of the dispenser. In other words, the dispenser ends up dispensing a beverage, for example, whereas the user merely intended to wipe down the sensor and/or dispenser more generally. Some dispensers known in the art have addressed this by including a mechanical key that the user inserts and turns to place the dispenser in a non-dispensing, cleaning mode before proceeding with the cleaning process. Other examples use a secondary input device, for example, a quick response (QR) reader through which selected QR code instructions may be entered as an electronic key. However, not every crew member will have a physical or electronic key, the key is subject to being lost, adds another step in the process, and/or the keyhole may not even be accessible if the dispenser is positioned too closely against walls or other equipment, for example. Other keyless options call for complicated touch patterns on the front touch screen, for example, to place the system in cleaning mode. However, this too has disadvantages, such as requiring the operator to memorize or otherwise review the process ahead of time rather than providing an intuitive solution with no learning curve.

As discussed above, current systems that provide touchless dispensing present challenging interfaces for non-dispensing functions, including cleaning. Dispenser systems require periodic cleaning, which necessarily may require approaching or touching a proximity sensor to clean, thereby triggering a dispense action. There is a need to disable dispense or put the unit into a "cleaning mode" to allow cleaning activities that would normally trigger dispense to proceed without dispensing. As the touchless interface may be a retrofitted solution, such systems may have no other mechanisms for providing input (in other words, no way to disable dispensing). In addition, in a crowded location, it is possible that a person simply walking in close proximity to the device may cause an unwanted dispense action, risking spills, waste, and customer dissatisfaction.

Figure 1:
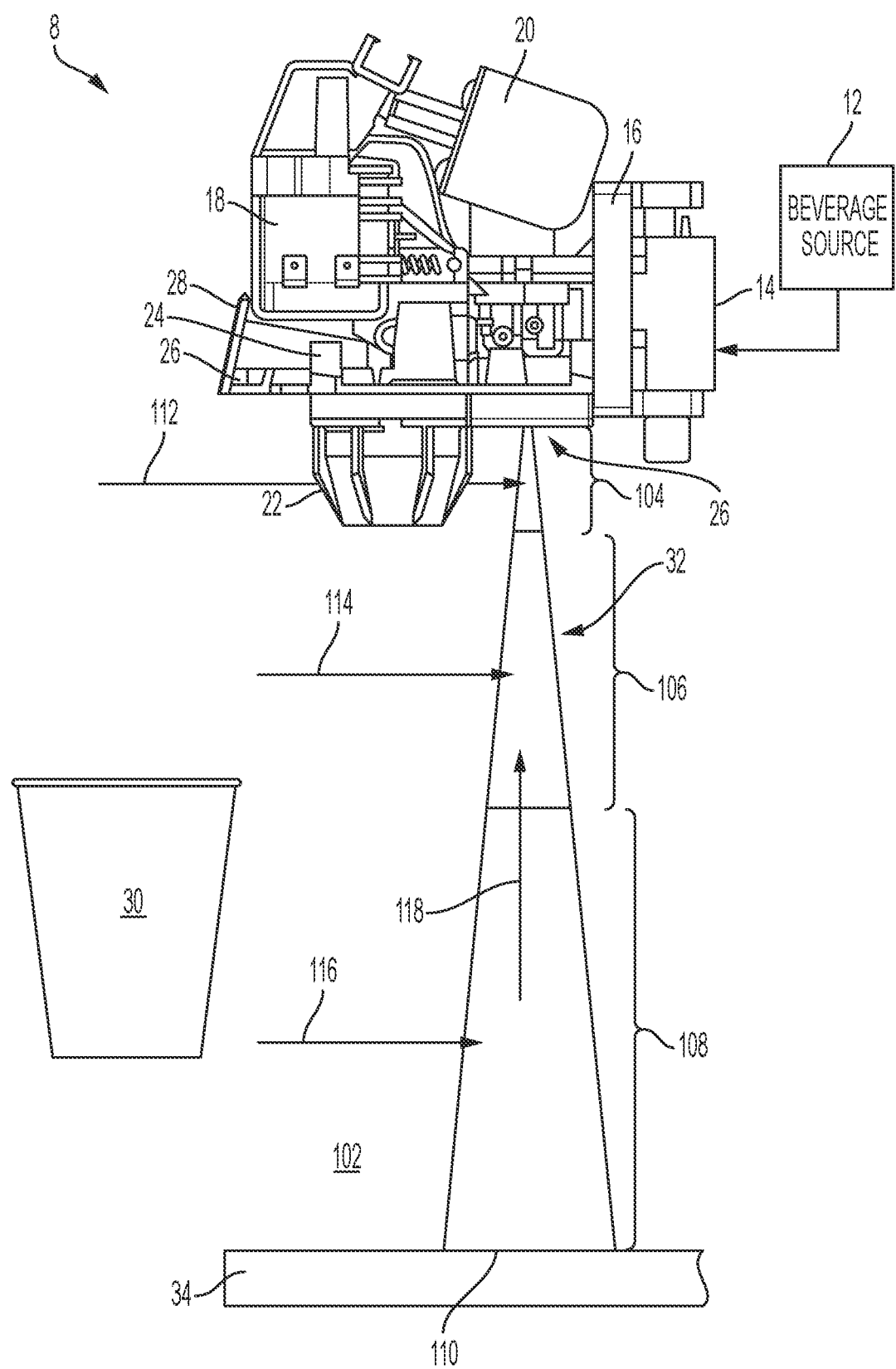
FIG. 1 is a side view of a beverage dispenser.

FIG. 1 depicts an example of a beverage dispenser 10. The beverage dispenser 10 includes a beverage source 12. The beverage source 12 may include one or more reservoirs of pre-mixed beverages. The beverage source 12 may include one or more reservoirs of concentrated flavoring along with at least one source of diluent, for example, still or carbonated water. The reservoirs of concentrated flavoring may, for example, be refillable containers or replaceable boxes, bags, or cartridges filled with concentrated flavoring. The beverage source is connected to a back block 14 which is in turn connected to a valve mounting block 16. The valve 20 is connected to the valve mounting block 16. A solenoid 18 operates as described herein to selectively move the valve 20 between an open position and a closed position. When the valve is in the open position, fluid from at least one reservoir of the beverage source 12 is permitted to flow through the valve 20 and exit through a nozzle 22. When the valve 20 is in the closed position, fluid flow from the at least one reservoir of the beverage source 12 is occluded from the nozzle 22.

It will be recognized that other examples of beverage dispensers 10 may be configured with multiple iterations of the components depicted in FIG. 1, for example, to concurrently operate to dispense more than one beverage. Further examples, may be configured to dispense ice as is provided in the Applicant's IDC Pro product. Additional examples and details of beverage dispensers are provided in Applicant's co-pending U.S. patent application Ser. No. 17/313,542, which is hereby incorporated by reference in its entirety.

The beverage dispenser 10 includes a controller 24, which is exemplarily a single board computer (SBC) or a central processing unit (CPU), that includes a processor. The processor of controller 24 may be integral with or communicatively connected to a computer-readable medium upon which computer-readable code is stored. Upon execution of the computer-readable code by the processor, the processor performs functions and calculations and subsequently transmits control signals as described herein. The controller 24 is communicatively connected to a feedback device 28, which may be a graphical display, for example a liquid crystal display (LCD) or an array of light emitting diodes (LEDs). In examples, the feedback device 28 may operate to visually indicate an operational mode of the beverage dispenser, or a current zone of a detected object both concepts which will be described in further detail herein. The visual presentation of such information back to the user can further facilitate user operation of the beverage dispenser. It will be recognized that the controller 24 may be physically located elsewhere in relation to the beverage dispenser 10 other than that as depicted in FIG. 1 while remaining within the scope of the present disclosure. Such locations may include a separate electronics and electrical communication housing to centrally locate all controllers and/or controller functions within the beverage dispenser, particularly examples with multiple dispensing subsystems. Other examples, may locate the controller 24 remote to the beverage dispenser, the controller 24 being communicatively connected to components of the beverage dispenser 10 as described herein through wireless connections.

The controller 24, is further communicably coupled to at least one sensor 26, as will be explained in further detail herein as well as communicatively connected to the valve solenoid 18. As will be detailed herein, the controller 24 operates to receive and interpret signals from the at least one sensor 26 to detect interactions in proximity to the beverage dispenser, interpret those interactions, and operate the beverage dispenser accordingly in response to the interpreted interactions to provide a beverage dispenser 10 with touchless beverage dispense operation.

In examples, the beverage dispenser 10 operates to dispense a beverage into a receptacle 30 based upon a touchless interaction detected by the at least one sensor 26. The sensor 26 includes one or more optical sensors as described in further detail herein which register the touchless interaction for subsequent interpretation by the controller 24. The at least one sensor 26 may be any of a variety of photoelectric sensors. Examples photoelectric sensors include, but are not limited to a through-beam sensor, a reflective through-beam, a reflective laser, or a diffuse photoelectric sensor. While an example of an infrared (IR) sensor is provided herein, sensors within the scope of the present disclosure may operate within visible or infrared (IR) light frequency bands. The sensor 26 may further be implemented with electronic circuitry which to control the operation of the sensor 26. As an example, a VL6180 proximity sensing module manufactured by STMicroelectronics may be used which includes both an infrared emitter and a range sensor, and signal preprocessing capability to communicate with the controller 24. Other implementations within the scope of the present disclosure may use one or more of other types of sensors, including but not limited to laser, lidar, radar, or ultrasonic. In further examples, two or more sensing technologies may be used to confirm sensor results.

Figure 2:
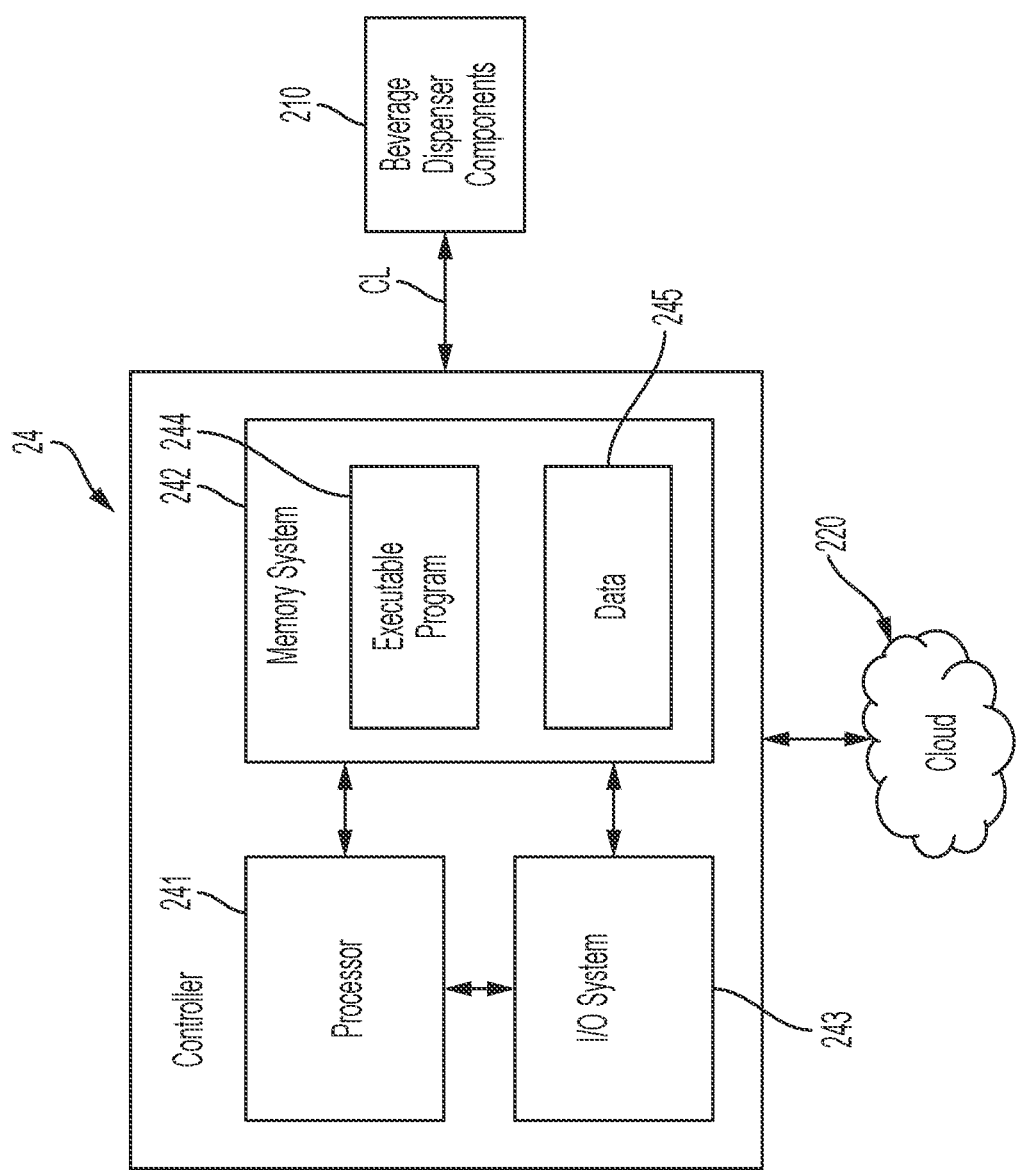
FIG. 2 is a schematic view of a controller for a beverage dispenser.

FIG. 2 depicts a more detailed view of a controller 24 as referenced above with respect to FIG. 1. It will be recognized that certain aspects of the present disclosure are described or depicted as functional and/or logical block components or processing steps, which may be performed by any number of hardware, software, and/or firmware components configured to perform the specified functions. For example, certain embodiments employ integrated circuit components, such as memory elements, digital signal processing elements, logic elements, look-up tables, or the like, configured to carry out a variety of functions under the control of one or more processors or other control devices. The connections between functional and logical block components are merely exemplary, which may be direct or indirect, and may follow alternate pathways.

In certain examples, the controller 24 communicates with each of the one or more components 210 of the beverage dispenser 10 via a communication link CL, which can be any wired or wireless link. The controller 24 is capable of receiving information and/or controlling one or more operational characteristics of the beverage dispenser components 210 by sending and receiving control signals via the communication links CL. In one example, the communication link CL is a controller area network (CAN) bus; however, other types of links could be used. It will be recognized that the extent of connections and the communication links CL may be one or more shared connections, or links, among some or all of the beverage dispenser components 210. Moreover, the communication link CL lines are meant only to demonstrate that the various control elements are capable of communicating with one another, and do not represent actual wiring connections between the various elements, nor do they represent the only paths of communication between the elements. Additionally, the beverage dispenser components 210 may incorporate various types of communication devices and systems, and thus the illustrated communication links CL may represent various types of wireless and/or wired data communication systems.

The controller 24 may be a computing system that includes a processor 241, memory 242 embodied on one or more non-transient computer readable media, and input/output (I/O) system 243 for communicating with the beverage dispenser components 210, as will be discussed in further detail herein. The beverage dispenser components 210 in FIG. 2 generally refer to other electronic components of the beverage dispenser 10, as described herein including, but not limited to, the solenoid 18, the feedback device 28, and the at least one sensor 26 (FIG. 1). The processor 214 loads and executes an executable program 244 from the memory 242, accesses data 245 stored within the memory 242, and processes inputs received from the beverage dispenser components 210 to produce control signals which are communicated to beverage dispenser components 210 to carry out the functions as described herein The processor 241 may be implemented as a single microprocessor or other circuitry, or be distributed across multiple processing devices or sub-systems that cooperate to execute the executable program 244 from the memory 242. Non-limiting examples of the processor 241 include general-purpose central processing units, application-specific processors, and logic devices.

The memory 242 may comprise any storage media readable by the processor 241 and capable of storing the executable program 244 and/or data 245. The memory 242 may be implemented as a single storage device, or be distributed across multiple storage devices or sub-systems that cooperate to store computer-readable instructions, data structures, program modules, or other data. The memory 242 may include volatile and/or non-volatile memory, and may include removable and/or non-removable media implemented in any method or technology for storage of information. The storage media be non-transitory random access memory, read-only memory, magnetic discs, optical discs, flash memory, virtual memory, and non-virtual memory, magnetic storage devices, or any other storage medium which can be used to store information and be accessed by an instruction execution system.

Referring back to FIG. 1, the beverage dispenser 10 described above operates to provide touchless interaction with users. This touchless interaction includes both the operation of the dispensing function of the beverage dispenser 10 as well as maintenance operations, for example cleaning of the beverage dispenser 10, while rejecting accidental or incidental interactions. As described above, the beverage dispenser 10 includes at least one sensor 26. It will be recognized that FIG. 1 presents one configuration of the beverage dispenser, while other configurations will be described herein. It will be recognized from the present disclosure that examples of the beverage dispenser 10 that incorporate combinations, duplicates, or variations of the described configurations are within the scope of the present disclosure. The at least one sensor 26 may be a proximity sensor that detects a distance from the sensor 26 of an object within a detection zone 32 of the sensor. Other examples of the at least one sensor 26 may include, but are not limited to a camera and computer vison system, LIDAR, RADAR, Ultrasonic, or others known in the art. The at least one sensor 26 presents a detection zone 32 within a field of view of the at least one sensor 26. While it may be recognized that the detection zone 32 may be a line, fan, or another shape, the example described herein will exemplarily use a detection zone 32 having a cone shape. The detection zone 32 may therefore be understood to have a cross-sectional area of a plane through the detection zone 32 normal to an axis of the detection zone that increases with increases in a distance from the sensor 26. It will further be recognized that the detection zone 32 may further include a maximum effective distance beyond which proximity to the sensor is not registered by the system. This maximum effective distance may be determined based upon the sensor and processing capabilities. Alternatively, the maximum effective distance may be determined based upon a physical design of the beverage dispenser 10, for example, if the beverage dispenser includes a drip tray 34 or another physical component that blocks further extent of the detection zone 32.

In the processing and interpretation as will be described herein, all of the areas outside of the detection zone 32 are identified as the distant zone 102. The distant zone 102 may be in line with the sensor 26, but at a distance beyond the maximum effective distance. The distant zone 102 may further include areas lateral to the detection zone 32 but outside of the cross-sectional shape of the detection zone 32 at that distance from the sensor 26. Within the detection zone 32, the detection zone 32 may be conceptually divided into three sub-zones relative to respective distances from the sensor 26. In the example presented herein, these sub-zones may include a cleaning zone 104 in the volume of the detection zone most proximate the sensor 26, a dispense zone 106 in the volume after the cleaning zone 104, and an approach zone in the volume beyond the dispense zone 106, but bounded by the maximum effective distance 110. As will be explained in further detail herein, the at least one sensor 26 operates to provide a distance from the sensor to an object detected within the detection zone 32. The controller 24 operates to interpret a detected interaction based upon a current determined sub-zone of the detected object and a time and context of the current determined sub-zone. The interpretation may, for example, include identification of requesting dispense, cleaning, or accidental interactions. Based upon the identified interaction, the controller 24 can provide control signals to the components of the beverage dispenser to respond accordingly. It will be recognized that the location(s) of the at least one sensor 26 and/or the object or expected object within the detection zone 32 may result in different analysis and determinations herein.

The controller 24 identifies portions of signals received from the at least one sensor 26 which correspond to the above zones and uses these identifications to interpret various interactions with the beverage dispenser 10. For example, the distant zone 102 is any location outside the field of view of the sensor and exemplarily represents actions that are too far away to represent meaningful interaction with the beverage dispenser 10 such as to elicit an action response from the beverage dispenser 10. The approach zone 108 may be entered by a receptacle 30 or hand 36 to initiate a dispense, or may be an accidental or incidental interaction of, for example, a person walking past the beverage dispenser. The dispense zone 106 represents a range of distances from the at least one sensor 26 that are indicative of, but not always determinative of, a deliberate intention to trigger a dispense action. While the cleaning zone 104 represents a range of distances from the at least one sensor 26 that are indicative of, but not always determinative of, a cleaning action, requiring a cleaning mode operation.

Through experimentation and development, the inventor has recognized that by evaluating the sensor signals as a detected object moves through the zones of the detection zone the user's natural interaction with the device can be accurately and repeatably interpreted as a control input. The controller 24 then operates the beverage dispenser 10 according to the interpreted control input. While this analysis will be described in further detail herein, arrows 112, 114, 116, and 118 depict four different movement paths detected by the at least one sensor 26. As will be described in further detail herein movements associated with arrows 112 and 118 may be treated as more instructive of an intentional cleaning or dispense interaction, respectively. Exemplary movements represented by arrows 114 or 116 may be subjected to further processing to reject accidental or inadvertent interactions.

Figure 3:
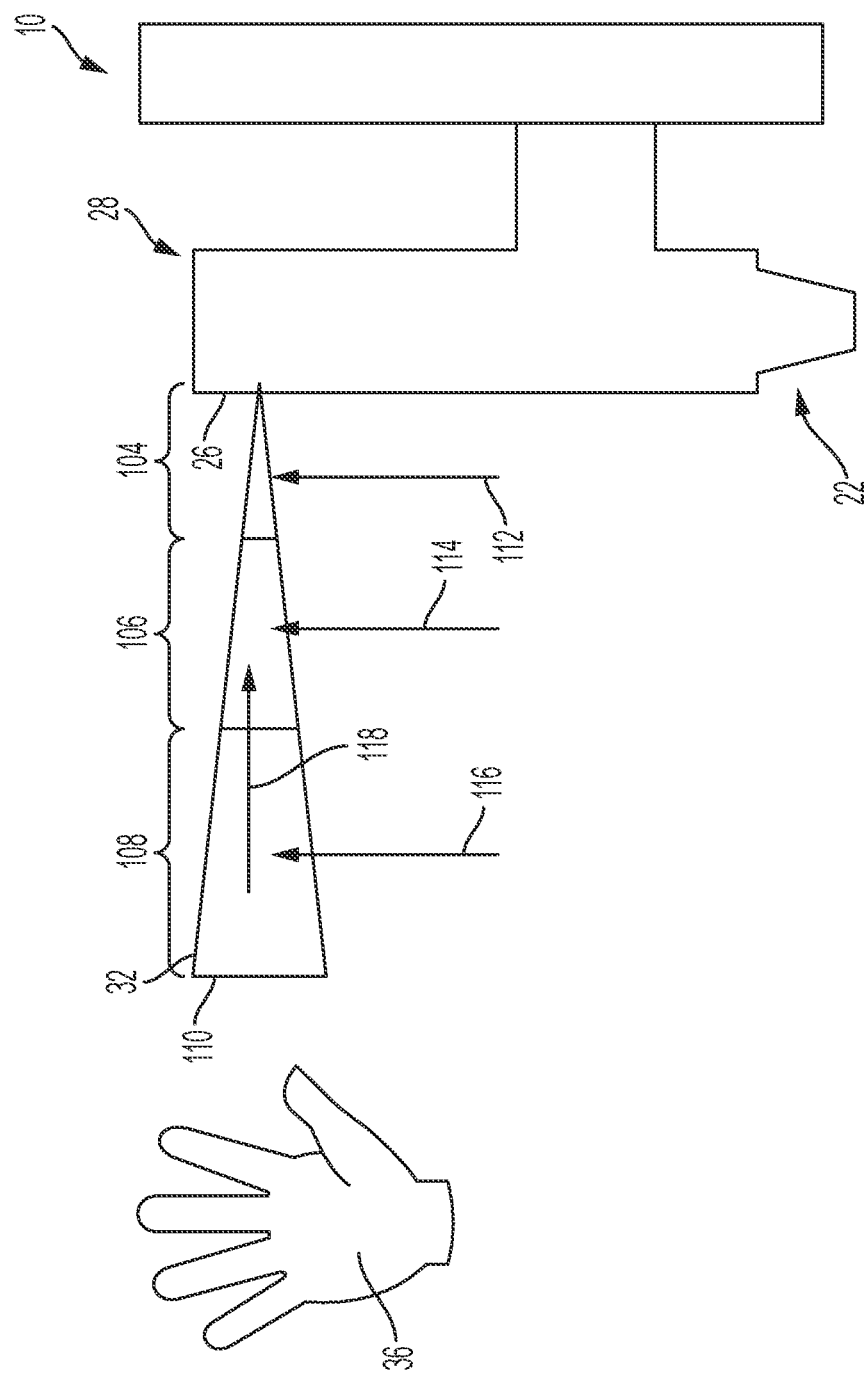
FIG. 3 is a side schematic view of an example embodiment of the beverage dispenser.

The example of FIG. 1 depicts at least one sensor 26 arranged proximate the nozzle 22, which is principally arranged to detect a receptacle positioned below the nozzle 22. FIG. 3 provides an example of at least one sensor 26 oriented outwards from the beverage dispenser 10, for example to detect a hand 36 and/or gestures thereof. It will be recognized that the operation of the beverage dispense 10 is the same as that as described above with respect to FIG. 1 above, apart from the specific features noted herein with respect to FIG. 3. It will further be noted that while FIG. 1 and FIG. 3 are presented as separate examples, the features of these two examples may also be used in combination while remaining within the scope of the present disclosure. The at least one sensor 26 is exemplarily incorporated into, or is located proximate to, the feedback device 28 and the detection zone 32 is exemplarily oriented forward of the beverage dispenser. During use, a receptacle 30 may be positioned below the nozzle, for example resting upon the drip tray 34.

Similar to that as described above, the beverage dispenser 10 of FIG. 3 provides for dispense of a beverage in response to detection of an object within the detection zone 32. As will be described in further detail herein, in examples, the system may ignore or used heightened scrutiny when output signals from the at least one sensor 26 indicate movement of an object in a movement path with a higher chance of being an accidental or inadvertent interaction. In contrast output signals from the at least one sensor 26 indicative of movement of the object in a deliberate path indicative of a dispense or cleaning of the sensor is interpreted as such to improve input command detection and a response time of the controller. This enables touchless dispense and selection between cleaning and dispensing modes without any additional mechanisms, such as keys or unusual unlocking patterns to be made on the feedback device 28 or elsewhere.

Figure 4:
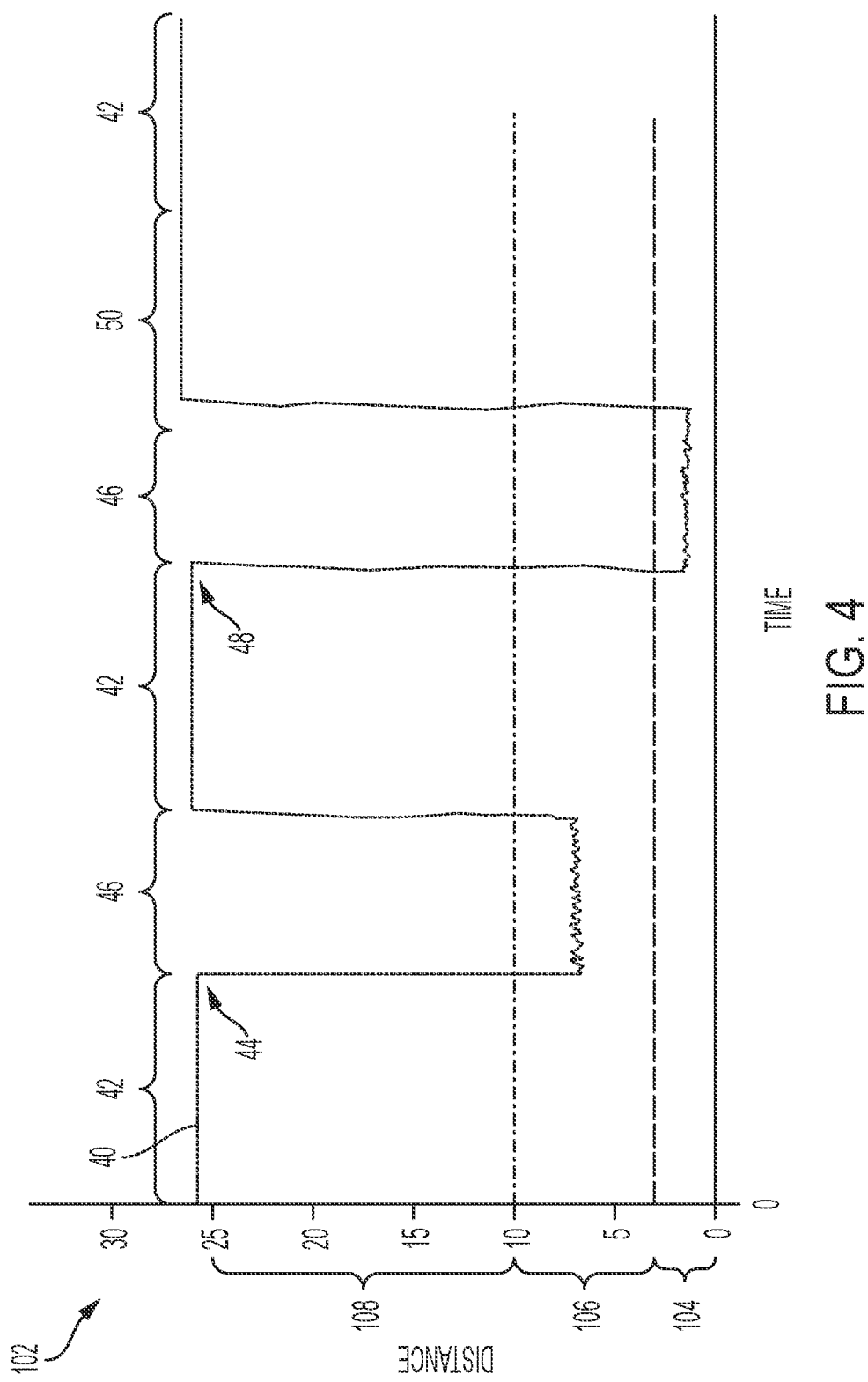
FIG. 4 is a data plot of an exemplary output signal from a sensor of a beverage dispenser.

FIG. 4 is a graph that presents an example of an output signal 40 provided by the at least one sensor 26 to the controller 24. The output signal 40 is exemplarily an indication of a measured distance over time. The graph includes representative indications for examples of the approach zone 108, dispense zone 106, and the cleaning zone 104. In non-limiting examples, the distances associated with the aforementioned zones are 225 mm, 75 mm, and 20 mm from the at least one sensor 26, respectively. In another example, the approach zone may start at 180 mm, the dispense zone start at 160 mm and the cleaning zone start at 40 mm from the at least one sensor 26. In a still further example, only a dispense zone 106 and a cleaning zone 104 are delineated.

Initially, the beverage dispenser may be operating in a standby mode 42, wherein the beverage dispenser is not actively dispensing, but is analyzing the output signal for a user interaction to change to a dispense mode or a cleaning mode of operation. Output signal 40 initially presents a detection in the distant zone, in which a nominal distance (e.g. the maximum effective distance), for example 26 cm is measured. At reference point 44 an object, which for example, may be a hand, a hand with a cloth, or a receptacle enters the detection zone and is sensed by the at least one sensor. The output signal 40 reflects this detection by indicating new distance measurements lower than the nominal distance. In this example, the new distance measurements fall within the dispense zone 106. This represents that the object is first detected within the dispense zone. A first detection of the object within the dispense zone 106 is indicative of a movement path from the distant zone 102 to the dispense zone 106. However, it has been recognized that accidental or incidental interactions may also be first detected within the dispense zone, following this movement path. The controller 24 responds to this input signal in an evaluation operation 46 and evaluates the output signal 40 for a predetermined time period (e.g. 500 ms). If the output signal 40 remains within the detection zone 106 for greater than the predetermined time period, then the controller 24 operates to initiate a dispense of the beverage. However because of the recognized uncertainty to an output signal initially detected in the dispense zone 106, the predetermined time period may be longer e.g. greater than 500 ms, between 500 ms-1000 ms, or greater than 1000 ms.

In the example of FIG. 4, the output signal 40 remains within the dispense zone 106 during the evaluation for a time period that is exemplarily less than the predetermined time period before the output signal 40 returns to the nominal distance. No dispense is initiated, as this is interpreted as an accidental or incidental detection. If the output signal 40 had remained within the dispense zone 106 for longer than the predetermined time period, then the controller 24 would have operated dispenser into a dispense mode the solenoid to move the valve into the open condition to initiate a dispense of the beverage. The controller 24 would have continued to operate the solenoid to maintain the valve in the open position, until the controller determined that the output signal 40 left the dispense zone in a direction of the nominal distance, or if a predetermined dispense time (e.g. 10 seconds) timed out.

The output signal 40 returns to the nominal distance and the controller 24 operates in the standby mode 42. At reference point 48, an object again enters the detection zone and is sensed by the at least one sensor. The output signal 40 from the at least one sensor reflects this detection by indicating new distance measurements, this time within the cleaning zone 104. A new evaluation operation 46 is initiated. Because initial detection of an object within the cleaning zone 104 represents more intentional interaction, the predetermined time period in the evaluation operation may be either less (e.g. less than 500 ms or between 100-200 ms). However, as will be described in further detail herein, in other examples, because entering the cleaning mode temporarily disables some dispenser functions, the predetermined time period to enter the clean mode may be higher, e.g. greater than 1000 ms. After the evaluation operation 46, the controller may operate in a cleaning mode 50, wherein the controller 24 counts a predetermined cleaning delay (e.g. 1-10 seconds) wherein no dispense operations are initiated. The cleaning mode 50 may persist independent of a current distance measurement of the output signal 40. After the cleaning delay has expired, the controller 24 may return to the standby mode 42.

Figure 5A:
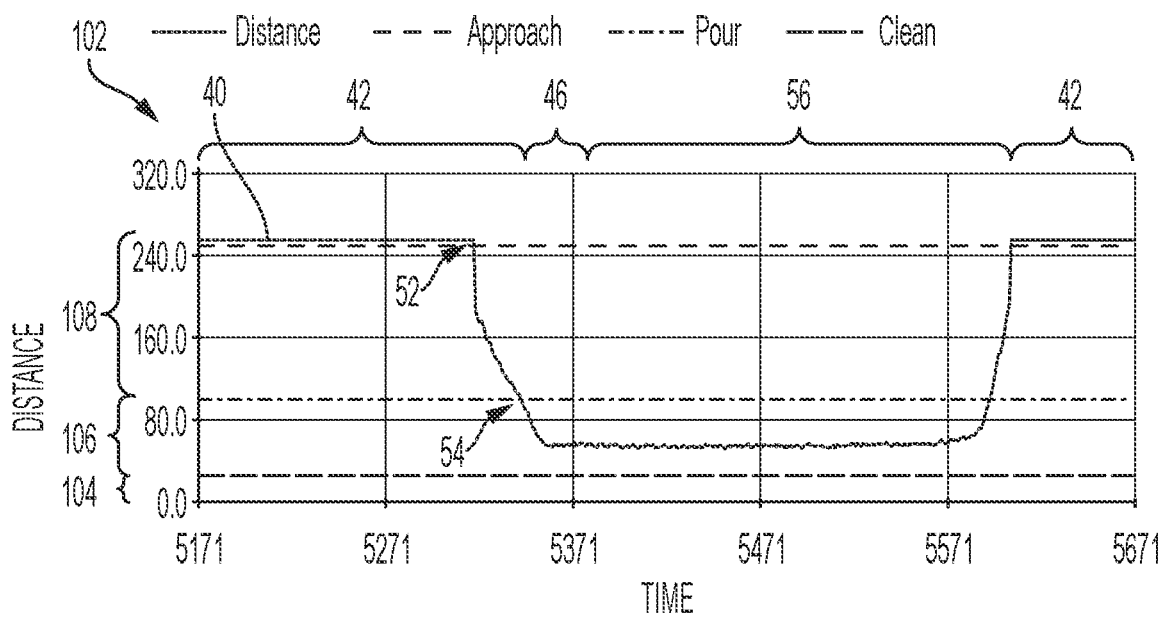
FIGS. 5A and 5B are further data plots of exemplary output signals from a sensor of a beverage dispenser.
Figure 5B:
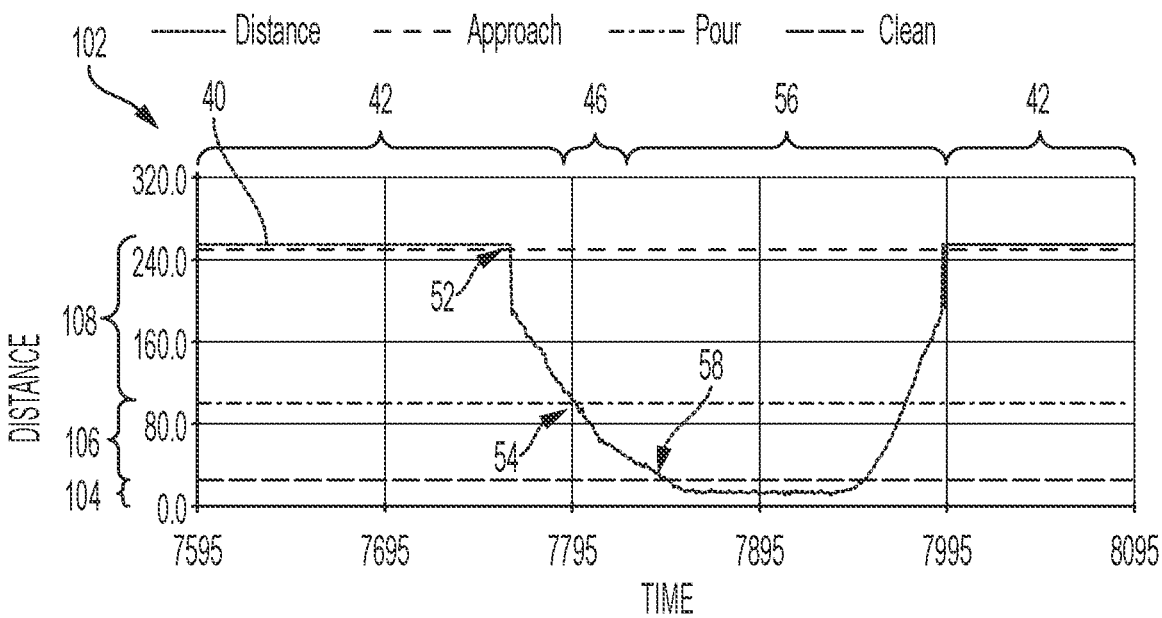

FIGS. 5A and 5B present further graphs with examples of output signals from at least one sensor as described herein. In FIG. 5A, the beverage dispenser again exemplarily begins in a standby mode 42 and the output signal 40 indicates a detection in the distant zone 102. At reference point 52 an object enters the detection zone and is sensed by the at least one sensor to be in the approach zone 108. Detection of an object in the approach zone 108 has a comparatively high likelihood of being an accidental or incidental interaction and the dispenser remains in the standby mode. However at 54, the detection of the object enters into the dispense zone, representing an object path from the distant zone 102 to the approach zone 108 to the dispense zone 106. This object path is deemed to have increased confidence of an intentional action and a dispense request. Therefore, a shorter time predetermined time period (e.g. less than 500 ms or between 100 ms-200 ms, or other periods) may be used to evaluate the input in an evaluation operation 46 before the beverage dispenser is operated in the dispense mode 56 to dispense the beverage.

FIG. 5B depicts a similar interaction and output signal 40, however, after the dispense mode 56 is entered, at reference point 58, the output signal 40 crosses into the clean zone 104. However, because the dispenser is already operating in the dispense mode, this further change in the interaction is interpreted as inadvertent and the dispenser remains in the dispense mode 56.

Figure 6:
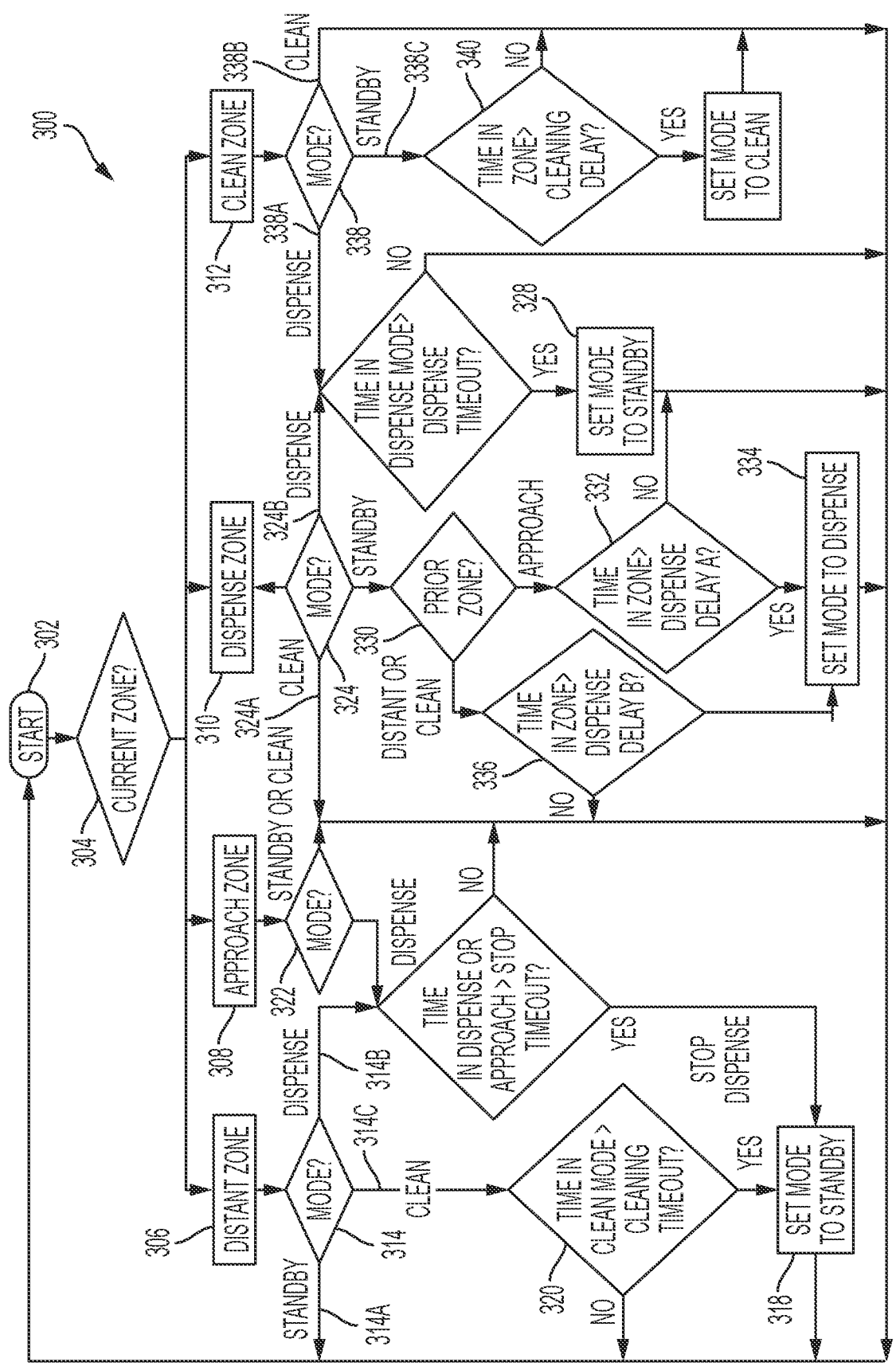
FIG. 6 is a flow chart that presents an example of a method of dispensing a beverage.

FIG. 6 is a flow chart that depicts an example of a method 300 of beverage dispenser control. It is recognized that the method 300 may be carried out by the beverage dispenser 10 as previously described, or may be carried out by a dispenser of a different configuration while remaining within the scope of the present disclosure. The method 300 starts at 302 where output signals from at least one sensor are received by a controller. As disclosed above, an example dispenser includes at least one sensor that produces output signals representative of a measured distance between the sensor and a closest object within a detection zone. The detection zone of the at least one sensor includes a plurality of sub-zones defining representative ranges of distances from the sensor to the object. These sub-zones may include a cleaning zone in the range closest to the sensor, then a dispense zone, then an approach zone, followed by a distant zone outside of the detection zone. At 304 a current zone of a detected object is determined. In an example, an output signal indicating a nominal or maximum sensor distance represents no object within the detection zone, or that any object is in the distant zone. In a further example, each zone is defined by a threshold distance that defines a subsequently closer zone. The current zone can thus be determined at 304 by comparing the current sensor output value to the associated zone threshold values, examples of which are presented above. At 304, a determination for the current zone is made between the distant zone 306, the approach zone 308, the dispense zone 310 and the clean zone 312.

If the current zone is determined in step 304 to be the distant zone 306, the process next evaluates a current mode of the dispenser at 314. The mode of the dispenser is an operational condition which may be a function or routine performed by the dispenser, e.g. dispense mode, standby mode, or clean mode. If the dispenser is currently in a standby mode 314A, then the process returns to step 302 and continues to evaluate the sensor output signals.

If at 314B the dispenser is currently in the dispense mode, then at 316 an evaluation is made if the sensor indicates that the detected object is outside of the dispense zone for a predetermined stop timeout time. In an example, the stop timeout time may be 100 ms or less, as detection of the object outside of the dispense zone (e.g. in the approach zone or distant zone) may indicate that the cup is no longer in a position to collect the dispensed beverage and therefore the dispense mode should be ended. However, in other examples, this stop timeout time may be longer, for example if the sensor is directed below the nozzle and the dispenser provides room for the cup to be lowered to the approach or distant zone while still collecting the dispensed beverage. If the stop timeout time has not been reached, then the process returns to step 302. If the stop timeout time has been reached, then the dispense mode ends and the dispenser is operated in the standby mode at 318, and the process returns to step 302.

Returning to 314, if at 314C the dispenser is in currently in the clean mode, the process continues to 320 and evaluates if an elapsed time that the current zone has been the distant zone exceeds a cleaning timeout time. That is, to exit the clean mode a predetermined time of no interaction with the dispenser (e.g. current zone is the distant zone) is required. In an example, the cleaning timeout time may be 2000 ms or 5000 ms, or values shorter or longer than these examples. If the cleaning timeout time has not yet been exceeded, the process returns to step 302. If the cleaning timeout has been exceeded, the dispenser switches back to the standby mode at 318 and returns to step 302.

If the current zone is determined in step 304 to be the approach zone 308, the process next evaluates a current mode of the dispenser at 322. If the dispenser is currently in the standby or the clean mode, then the process returns to step 302. If the dispenser is currently in the dispense mode, then the evaluation at 316 is made if the sensor indicates that the detected object is outside of the dispense zone for a predetermined stop timeout time, as described above. Additionally, the evaluation at 316 may be a summed duration of the time that the sensor has indicated the distant or approach zone without indicating the dispense zone or cleaning zone.

Returning to 304, if the current zone is determined to be the dispense zone 310, then the process next evaluates a current mode of the dispenser at 324. If the dispenser is currently in the clean mode 324A, then the process returns to step 302. If the dispenser is in the dispense mode, then at 326 an elapsed time that the dispenser has been in the dispense mode is evaluated against a predetermined dispense timeout time. The predetermined dispense timeout time may be 8000 ms or 10,000 ms, or another maximum dispense time predetermined for the operation of the dispenser. If the dispense timeout time has not been exceeded, then the process returns to step 302. If the dispense timeout time is met or exceeded, then the dispense of beverage in the dispense mode ends and the dispenser switches to the standby mode at 328. With the dispenser now in the standby mode, the process returns to step 302.

If, at 324C the sensor has detected an object in the dispense zone and dispenser is currently in the standby mode, then additional analysis is performed to more accurately determine interactions that are intended to initiate a dispense from interactions that are accidental or incidental. At 330, a prior detected zone is identified. That is, the sensor currently indicates that a detected object is in the dispense zone, but looks to identify in which zone the sensor detected an object prior to the dispense zone. In an example implementation, the controller may include memory in which an indication of the previously detected zone is stored. Performance of the identification at 330 may include accessing and reading this information from such a computer-readable memory. Identification of the prior zone provides information about the relative movement of the detected object to the sensor of the dispenser.

If the identified prior zone is the approach zone, then this progression of the location of the detected object from the approach zone to the dispense zone is indicative of an intentional action to dispense the beverage. At 332, a time that the object is detected in the dispense zone is evaluated against a dispense delay time (A). The dispense delay time may exemplarily be less than 500 ms while in some examples may be a shorter or a longer duration. The evaluation at 332 against the dispense delay time (A) further helps to ensure that a beverage dispense has been requested. If the dispense delay time (A) has not yet been reached in the evaluation, then the process returns to step 302. If the dispense delay time (A) has been reached, then the dispenser operates at 334 in the dispense mode to initiate the dispense of beverage.

Returning to 330, if the prior zone is determined to be the distant zone or the clean zone, then the progressions of these detected interactions have a lower degree of certainty, or likewise are more likely to be accidental or incidental interactions. However, for example, a sensor detected progression from the distant zone to the dispense zone could be indicative of a user bringing a cup into position below the nozzle from the side rather than from the front, while a sensor detected progression from the cleaning zone to the dispense zone may indicate a user who brought the cup too close to the nozzle before backing the cup off to the dispense zone. Therefore, the process evaluates these interactions at 336. At 336, similar to 332, a time that the object is detected in the dispense zone is evaluated against a dispense delay time (B). The dispense delay time may exemplarily be greater than 500 ms while in some examples may be a shorter or a longer duration. In examples, the dispense delay time (B) is longer than the dispense delay time (A). This is increased duration of the dispense delay time is reflective of the decreased certainty of the interaction that progresses from the distant or clean zones to the dispense zone as opposed to an interaction that progressed from the approach zone to the dispense zone. The evaluation at 336 against the dispense delay time (B) enables a beverage dispense to still be initiated, while providing increased robustness to reject accidental or incidental interactions. If the dispense delay time (B) is not yet been reached in the evaluation, then the process returns to step 302. If the dispense delay time (B) is been reached, then the dispenser operates at 334 in the dispense mode to initiate the dispense of beverage.

Returning to 304, if the current zone is determined to be the clean zone 312, then the process next evaluates a current mode of the dispenser at 338. If the dispenser is currently in the dispense mode 338A, then this interaction is likely indicative of the user drifting the cup placement during dispense and is treated as a continuation of the dispense, as described above, the interaction is continued to be evaluated at 326 to compare an elapsed time that the dispenser has been in the dispense mode against a predetermined dispense timeout time and the method continues as described above. If the dispenser is currently in the clean mode 324B, then the process returns to step 302.

If at 338, the dispenser is currently in the standby mode, then the interaction receives further evaluation to determine if the interaction is an instruction to enter the clean mode. At 340, a current duration of time that the sensor has detected an object in the clean zone is compared to a predetermined cleaning delay time. In examples, the predetermined cleaning delay time is equal to, or longer than, the dispense delay time (B). In an example the predetermined cleaning delay time is 5000 ms. The longer duration of the predetermined cleaning delay time requires a more intentional interaction with the dispenser prior to entering the clean mode. Because the clean mode disables the dispense function of the dispenser for a limited duration, a more lengthy duration is used to increase the required intentionality of the interaction to initiate the clean mode, and to improve rejection of accidental or inadvertent interactions. If the current duration of the time that the sensor has detected the object in the clean zone is less than the predetermined cleaning delay time, then the process returns to step 302 for continued evaluation. If the predetermined cleaning delay time is met or exceeded by the current duration of the time that the sensor has detected the objected in the clean zone, then the dispenser is operated to enter the clean mode at 342, disabling the beverage dispense function and, in examples some or all of any user input operations.

Figure 7:
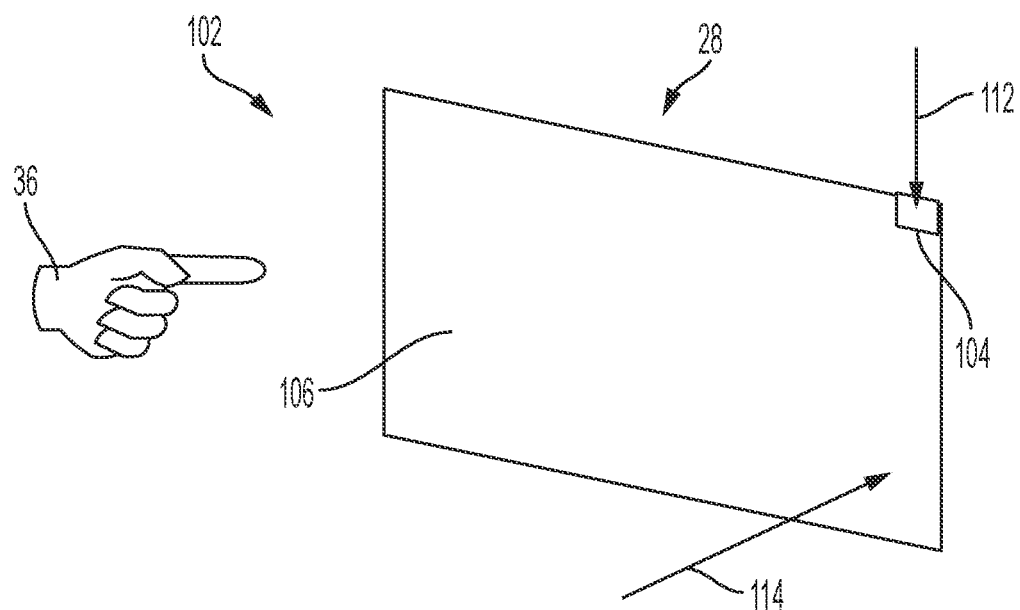
FIG. 7 is a schematic view of a 2D implementation of a user interface for a beverage dispenser.

The present disclosure can further be applied to touch-based systems to improve the ease of selecting between operating modes, and to avoid barriers such as keys. For example, FIG. 7 depicts the feedback device 28, which may exemplarily be a graphical display as described above, but further may be a touch-sensitive graphical display defining a 2D detection zone. The feedback device presents a dispense zone 106 and a cleaning zone 104. The distant zone 102 is spaced apart from the dispense zone 106 and the cleaning zone 104. Various 2D sensors, for example, touch-sensitive sensors or an array of linear proximity sensors or one or more proximity sensors with a planar detection zone are positioned in front of a graphical display, static artwork, or other visual presentation of information. Examples include but are not limited to a camera, radar, touch screen. A similar method as described above can be applied to this user interface configuration wherein the current detected zone of interaction is used in combination with the current mode of operation of the dispenser. Additional evaluation of the interaction may use the time of the interaction within that zone and a previous zone of interaction. Such an application of the method described above can further help to reject inadvertent or accidental interactions while properly initiating a beverage dispense or cleaning mode if requested by the user input. In an example, the system may exemplarily favor a dispense interaction (with a shorter confirmation time period) that is initiated with a progression from the distant zone to the dispense zone (e.g. along arrow 114) or favors a cleaning interaction that is initiated with a progression from the distant zone to the clean zone (e.g. along arrow 112).

Figure 8:
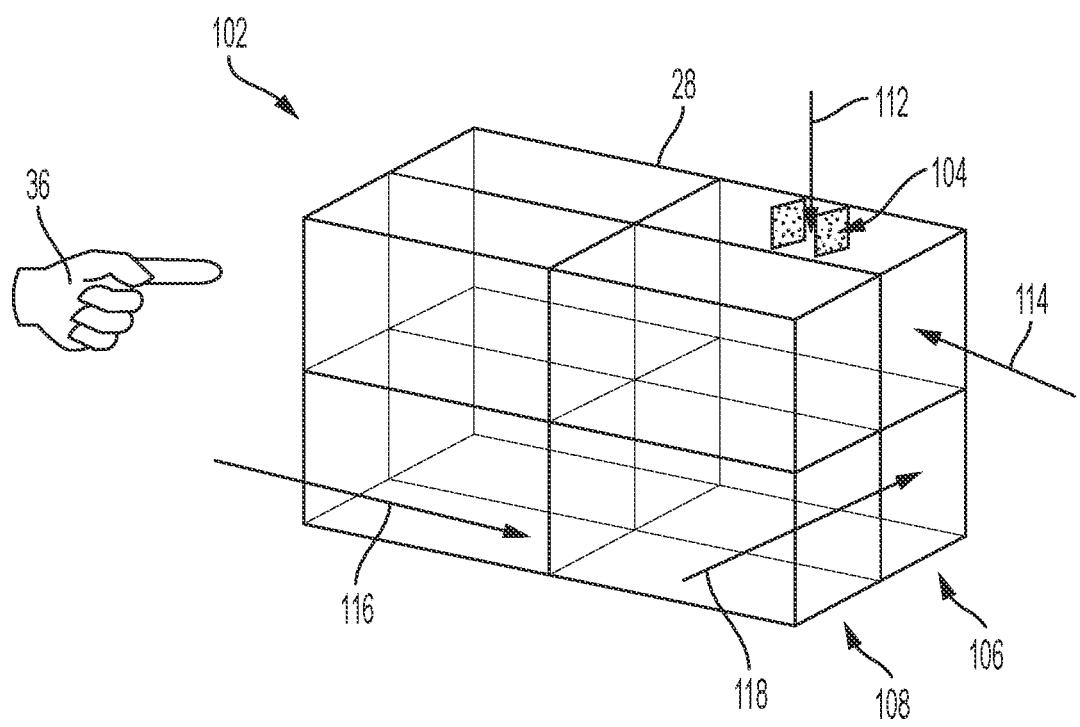
FIG. 8 is a schematic view of a further 3D implementation of a user interface for a beverage dispenser.

FIG. 8 depicts a similar embodiment to that as presented in FIG. 7, but with the further inclusion of a sensor that provides a 3D detection zone or adds a depth dimension of detection relative to the 2D surface of the feedback device 28 as described above with respect to FIG. 7. The sensor in this example may include a camera, radar, IR TOF (time of flight) array, or other distance or range-finding sensors known in the art. By providing at least one sensor that adds a depth dimension or range of an object (in this case a hand or finger) from the 2D surface, the system further defines a detection zone that enables identification of movement towards and away from the feedback device 28. Example depictions of the distant zone 102, approach zone 108, dispense zone 106, and the cleaning zone 104 are shown and the sensor output signals analyzed to determine a current and/or previous zone for a detected object. Example paths of interactions are represented by arrows 112, 114, 116, and 118 as previously described are further shown in this example.

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed:

1. A beverage dispenser comprising:
   a nozzle;
   a valve coupled upstream of the nozzle, the valve configured to control a flow of a substance through the valve to the nozzle;
   a solenoid operatively connected to the valve and configured to operate the valve between an open condition and a closed condition;
   a sensor operable to detect an object within a detection zone, the detection zone comprising a plurality of sequential sub-zones extending away from the sensor, the sensor operable to provide a signal representative of a distance between the object and the sensor; and
   a controller configured to receive the signal from the sensor, determine, from the signal, a current sub-zone from the plurality of sub-zones within the detection zone in which the object is located, select a predetermined evaluation time from a plurality of predetermined evaluation times based upon the current sub-zone, compare an elapsed time to the selected predetermined evaluation time, and operate the solenoid to control the valve between an open condition to dispense the substance through the nozzle and a closed condition based upon the comparison.

2. The beverage dispenser of claim 1, wherein the controller is configured to operate the beverage dispenser in a dispense mode in which the valve is controlled in the open condition and the controller is configured to operate in a standby mode in which the valve is controlled in the closed condition.

3. The beverage dispenser of claim 1, wherein the sensor is a proximity sensor.

4. The beverage dispenser of claim 1, wherein the detection zone is defined by a maximum effective distance of the sensor and the detection zone defines a distant zone outside of the detection zone, wherein the plurality of sub-zones includes a dispense zone as one of the sub-zones.

5. The beverage dispenser of claim 4, wherein the plurality of sub-zones includes a clean zone, wherein the clean zone comprises a portion of the detection zone extending from the sensor in the direction of the maximum effective distance until the dispense zone.

6. The beverage dispenser of claim 5, wherein the plurality of sub-zones includes an approach zone that extends from the maximum effective distance to the dispense zone.

7. The beverage dispenser of claim 6, wherein the controller is configured to determine an approach path of the object within one or more sub-zones.

8. The beverage dispenser of claim 1, wherein the controller is configured to:
   determine a current mode of operation of the dispenser, selected from at least a dispense mode and a standby mode, wherein the predetermined evaluation time is further selected based upon the current mode of operation; and
   based upon the comparison of the elapsed time to the selected predetermined evaluation time, set the current mode of operation of the beverage dispenser.

9. The beverage dispenser of claim 8, wherein the plurality of predetermined evaluation times comprises a first evaluation time and a second evaluation time wherein the first evaluation time is shorter than the second evaluation time.

10. The beverage dispenser of claim 9, wherein the detection zone is defined by a maximum effective distance of the sensor and the detection zone defines a distant zone outside of the detection zone, wherein the plurality of sub-zones includes a dispense zone, and wherein the current sub-zone is the dispense zone and the current mode of operation is the standby mode, and the controller is further configured to determine a prior zone of the plurality of sub-zones in which the object was located and based upon the determined prior zone, the controller selects between the first evaluation time and the second evaluation time.

11. The beverage dispenser of claim 10, wherein the plurality of sub-zones includes a clean zone that extends from the sensor to the dispense zone and the plurality of sub-zones includes an approach zone that extends from the dispense zone to the maximum effective distance, and wherein if the prior zone is the approach zone, the controller selects the first evaluation time and if the prior zone is the distant zone or clean zone, the controller selects the second evaluation time.

12. The beverage dispenser of claim 9, wherein the plurality of sub-zones includes a clean zone that extends from the sensor to the dispense zone and wherein the current sub-zone is the clean zone and the current mode of operation is a standby mode, the controller selects a third evaluation time of the plurality of predetermined evaluation times, the third evaluation time is longer than the first evaluation time and the second evaluation time.

13. A method of dispensing a beverage from a beverage dispenser, the method comprising:
   detecting an object within a detection zone of a sensor, the detection zone comprising a plurality of sequential sub-zones extending away from the sensor, the sensor producing a signal representative of a distance between the object and the sensor;
   determining, from the signal, a current sub-zone in which the object is located from the plurality of sub-zones within the detection zone;
   determining a current mode of operation of the dispenser;
   selecting a predetermined evaluation time from a plurality of predetermined evaluation times based upon the current sub-zone and the current mode of operation;
   measuring an elapsed time of the object in the detection zone;
   comparing the elapsed time to the selected predetermined evaluation time; and
   controlling the beverage dispenser in a dispense mode with a valve in an open condition to dispense a substance through a nozzle or controlling the beverage dispenser in a standby mode with the valve in a closed condition based upon the comparison of the elapsed time to the selected predetermined evaluation time.

14. The method of claim 13, wherein the detection zone is defined by a maximum effective distance of the sensor and the detection zone defines a distant zone outside of the detection zone, wherein the plurality of sub-zones within the detection zone comprises a dispense zone and a clean zone, wherein the clean zone is a portion of the detection zone between the sensor and the dispense zone.

15. The method of claim 14, wherein the plurality of sub-zones further includes an approach zone that extends from the maximum effective distance to the dispense zone.

16. The method of claim 14, wherein the plurality of predetermined evaluation times comprises a first evaluation time and a second evaluation time, wherein the first evaluation time is shorter than the second evaluation time.

17. The method of claim 16, wherein the current sub-zone is the dispense zone and the current mode of operation is a standby mode, and further comprising:
   determining, with the controller, a prior zone of the plurality of sub-zones in which the object was located; and
   selecting, with the controller, between the first evaluation time and the second evaluation time, based upon the determined prior zone.

18. The method of claim 17, further comprising:
   wherein if the prior zone is the approach zone, selecting the first evaluation time; and
   wherein if the prior zone is the distant zone or the clean zone, selecting the second evaluation time.

19. The method of claim 16, wherein the current sub-zone is the clean zone and the current mode of operation is a standby mode, and further comprising:
   selecting a third evaluation time of the plurality of predetermined evaluation times, wherein the third evaluation time is longer than the first evaluation time and the second evaluation time.

* * * * *